(12) United States Patent
Yun et al.

(10) Patent No.: US 8,003,423 B2
(45) Date of Patent: Aug. 23, 2011

(54) METHOD FOR MANUFACTURING A POLY-CRYSTAL SILICON PHOTOVOLTAIC DEVICE USING HORIZONTAL METAL INDUCED CRYSTALLIZATION

(75) Inventors: Jung-Heum Yun, Seoul (KR); Kwy-Ro Lee, Seoul (KR); Don-Hee Lee, Seoul (KR); Heon-Min Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 39 days.

(21) Appl. No.: 12/520,673

(22) PCT Filed: Jan. 9, 2008

(86) PCT No.: PCT/KR2008/000121
§ 371 (c)(1),
(2), (4) Date: Jun. 22, 2009

(87) PCT Pub. No.: WO2008/084974
PCT Pub. Date: Jul. 17, 2008

(65) Prior Publication Data
US 2010/0093126 A1    Apr. 15, 2010

(30) Foreign Application Priority Data
Jan. 9, 2007  (KR) .......................... 10-2007-0002611

(51) Int. Cl.
*H01L 21/00* (2006.01)

(52) U.S. Cl. .......... 438/58; 438/482; 438/488; 438/491; 257/E21.379

(58) Field of Classification Search .................. 438/58, 438/482, 488, 491
See application file for complete search history.

(56) References Cited

U.S. PATENT DOCUMENTS

| | | | |
|---|---|---|---|
| 6,048,758 A | 4/2000 | Yamazaki et al. | |
| 6,277,714 B1 | 8/2001 | Fonash et al. | |
| 6,451,637 B1 | 9/2002 | Jang et al. | |
| 6,884,698 B1 | 4/2005 | Ohtani et al. | |
| 2001/0000011 A1* | 3/2001 | Zhang et al. | 257/59 |
| 2001/0016376 A1* | 8/2001 | Yamazaki et al. | 438/156 |
| 2003/0141505 A1* | 7/2003 | Isobe et al. | 257/66 |

* cited by examiner

*Primary Examiner* — George Fourson
*Assistant Examiner* — John M Parker
(74) *Attorney, Agent, or Firm* — Birch, Stewart, Kolasch & Birch, LLP

(57) ABSTRACT

A method for manufacturing a poly-crystal silicon photovoltaic device using horizontal metal induced crystallization comprises the steps of forming at least one layer of an amorphous silicon thin film on a substrate, forming at least one groove of which depth is less than or equal to that of the thin film on the amorphous silicon thin film, and horizontally crystallizing the amorphous silicon thin film by forming a metal layer on an upper portion of the groove. Since a crystal shape and a growth direction of the photovoltaic device can be adjusted by the method, a poly-crystal silicon thin film for improving current flow can be formed at a low-temperature.

16 Claims, 3 Drawing Sheets

[Fig. 1]
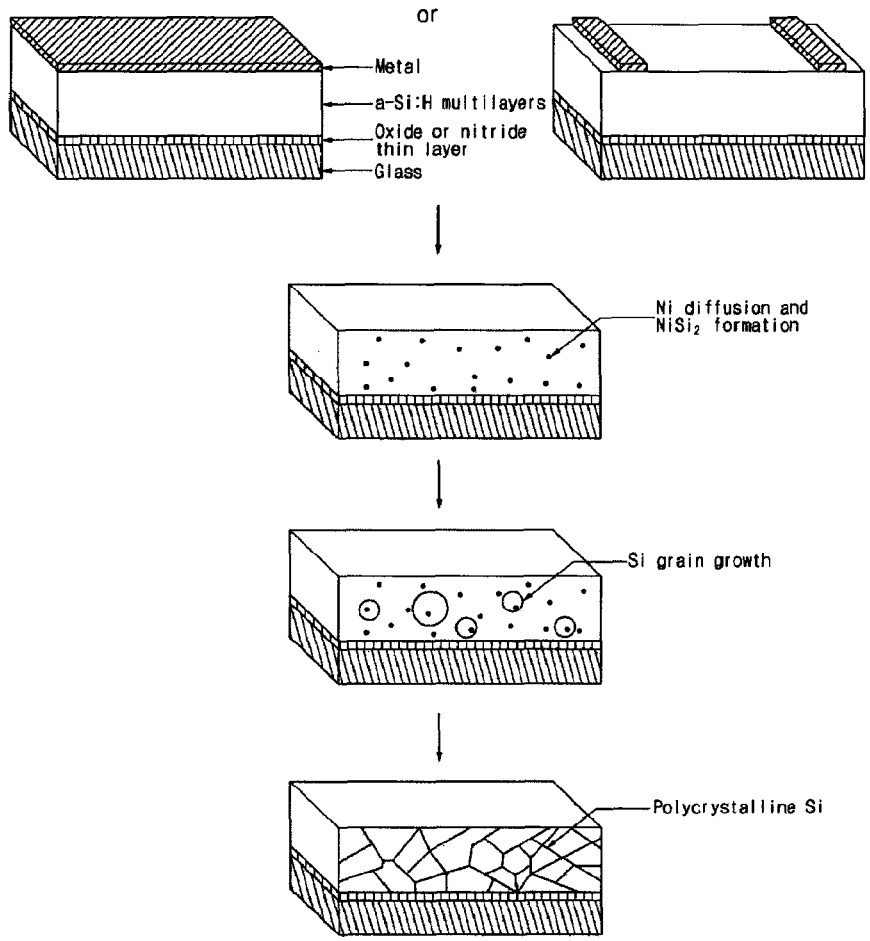
[Fig. 2]
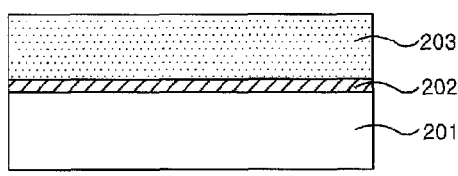
[Fig. 3]
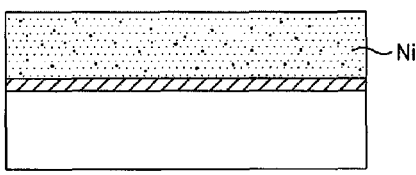
[Fig. 4]
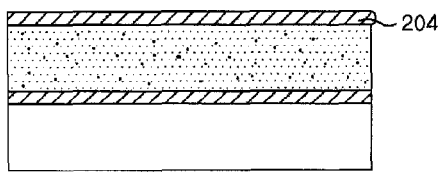

[Fig. 5]
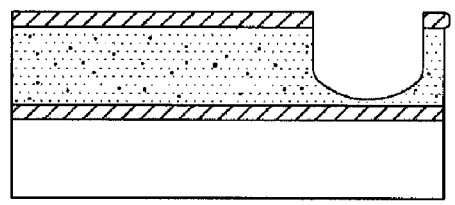
[Fig. 6]
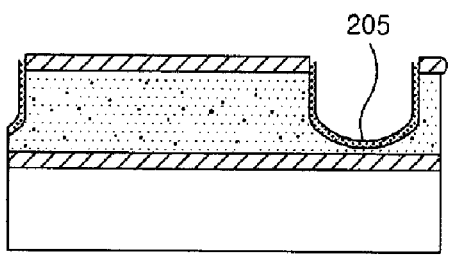
[Fig. 7]
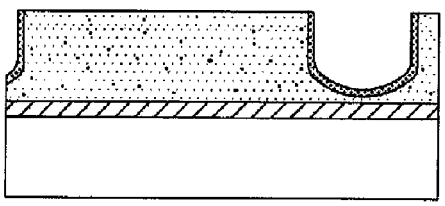
[Fig. 8]
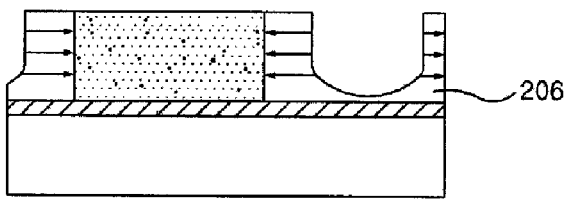
[Fig. 9]
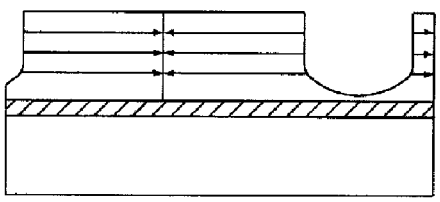
[Fig. 10]
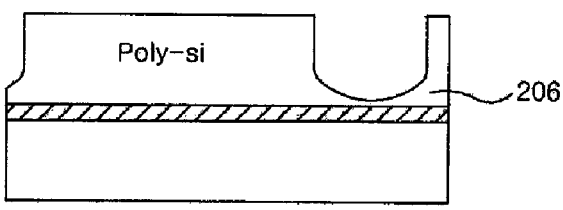

[Fig. 11]
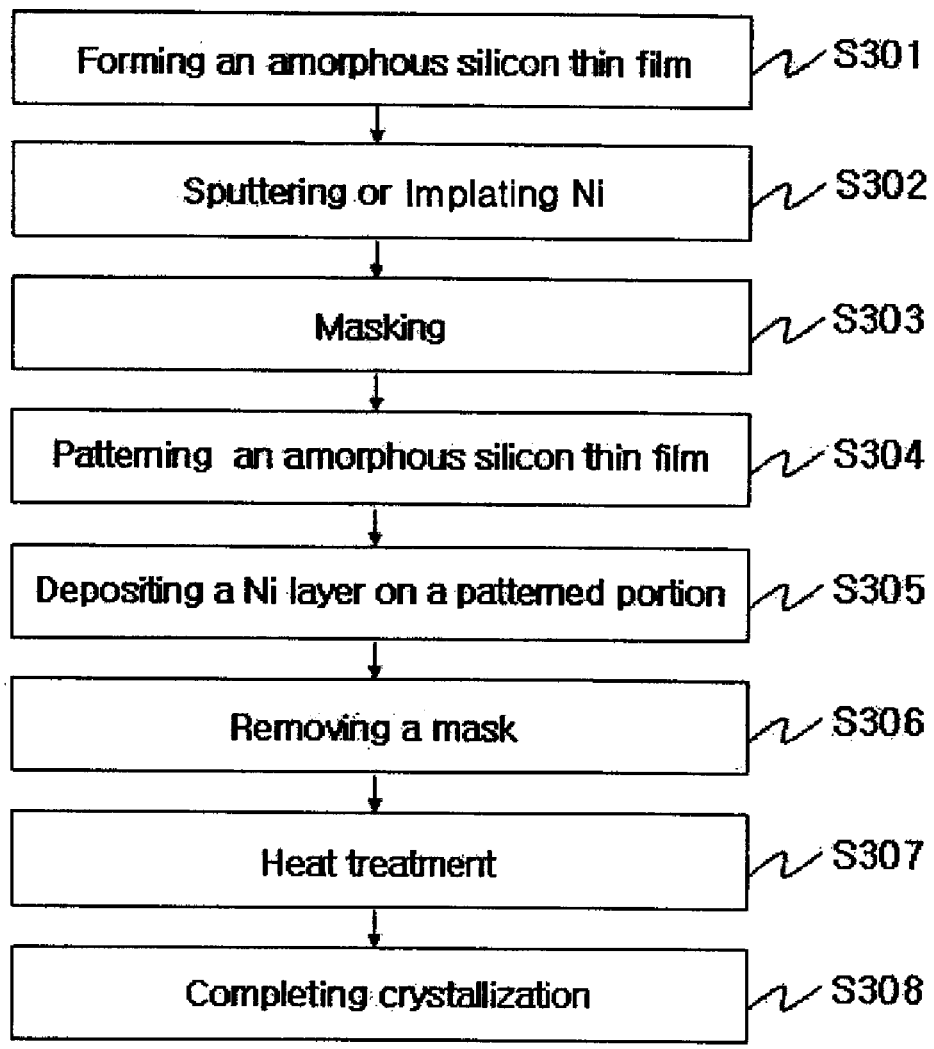

METHOD FOR MANUFACTURING A POLY-CRYSTAL SILICON PHOTOVOLTAIC DEVICE USING HORIZONTAL METAL INDUCED CRYSTALLIZATION

TECHNICAL FIELD

The present invention relates to a method for manufacturing a poly-crystal silicon photovoltaic device using horizontal metal induced crystallization, and more particularly, to a method for manufacturing a poly-crystal silicon photovoltaic device that includes a process for forming at least one layer of an amorphous silicon thin film on a substrate, forming at least one side sectional portion exposed on the amorphous silicon thin film, and horizontally crystallizing the amorphous silicon thin film at a low-temperature by forming a metal layer on the side sectional portion.

BACKGROUND ART

In general, a solar cell is one of photovoltaic devices.

A photovoltaic device is a clean energy source for producing energy by converting light energy transferred from the Sun to the Earth into electric energy. A lot of research has been actively conducted into photovoltaic devices for many years.

There is an advantage in that photovoltaic generation using a solar cell or the like can obtain an energy source using new renewable energy anywhere without destroying the environment.

Accordingly, research is being actively conducted into a next generation clean energy source for photovoltaic generation.

At present, the use of a Si single-crystal solar cell widely commercialized for photovoltaic generation is limited due to high manufacturing cost according to use of an expensive wafer.

To address this problem, various attempts have been proposed to develop a thin film solar cell capable of reducing the cost of raw materials and obtaining high efficiency and high reliability.

Among the various attempts, a method for significantly increasing the movement of carriers within a solar cell rather than amorphous Si using a poly-crystal Si thin film formed on a transparent glass substrate is very persuasive.

The aforementioned cell structure has sufficient current conductivity in the Si film itself without using a transparent conducting oxide (TCO) film between the glass substrate and the Si film, thereby remarkably reducing cost as a substitute for a transparent conducting film.

To manufacture poly-crystal Si having excellent properties on the glass substrate below a deformation temperature of glass, low-temperature crystallization of amorphous Si is known as an ideal method.

Among methods for manufacturing low-temperature poly-crystal Si, a method capable of preventing deformation of glass is: (1) an excimer laser annealing (ELA) method using an excimer laser, (2) a metal induced crystallization (MIC) method for inducing crystallization of amorphous Si at a low temperature using metal, and the like.

However, the use of the ELA method in the solar cell is limited due to low uniformity and high manufacturing cost.

In the MIC method as compared with this, specific metal is deposited on an amorphous Si film and then a heat treatment is applied, such that added metal plays a role as a catalyst to progress the Si crystallization. In this method, high uniformity can be achieved at low manufacturing cost.

The MIC method adds metal such as Al, Ni, Co, or the like to the surface of an amorphous Si thin film through sputtering or implantation and performs a heat treatment below a deformation temperature of glass, thereby achieving the Si crystallization.

In particular, when Ni is used, it is known that Si may be crystallized at a relatively low temperature and poly-crystal Si with an excellent crystalline quality may be manufactured.

The poly-crystal Si may be manufactured by moving a $NiSi_2$ phase serving as a combination of Ni and Si in an amorphous Si direction and continuously growing crystalline Si at the rear portion.

DISCLOSURE OF INVENTION

Technical Problem

Recently, a method for forming a metal film in a partial range on an amorphous Si thin film surface and starting Si crystallization from this metal pattern is used as a modified MIC method.

FIG. 1 is schematic view sequentially showing a method for manufacturing a poly-crystal silicon thin film solar cell using the conventional MIC method.

Referring to FIG. 1, there are shown a step of diffusing Ni particles by a Ni metal layer disposed or partially patterned on a multilayer structure of an amorphous silicon thin film (a-Si: H) to form a $NiSi_2$ phase serving as a combination of Ni and Si, and then a process of growing crystalline silicon.

However, the poly-crystal Si film manufactured by the conventional methods has many limitations in an application to the solar cell.

The poly-crystal Si manufactured by the conventional MIC method has a problem in that a crystal size and the number of defects occurring in the grain boundary surface are sensitively affected by a thickness of the Si film.

Since crystal growth is started from a metal film deposited on an upper or lower surface of amorphous Si, the growth is disorderly progressed in horizontal and vertical directions and the growth direction is not adjustable, such that crystals generated in different sizes and shapes make contact and many defects occur in the grain boundary surface.

Moreover, Si facing an oxide film in the poly-crystal Si thin film type solar cell requires high conductivity in the horizontal direction to play a role of TCO, but a current conductivity value decreases due to a large number of grain boundary surfaces and defects in a progress direction.

Technical Solution

According to an aspect of the present invention, there is provided a method for manufacturing a poly-crystal silicon photovoltaic device using horizontal metal induced crystallization, comprising the steps of: forming at least one layer of an amorphous silicon thin film on a substrate; forming at least one groove on the amorphous silicon thin film; and horizontally crystallizing the amorphous silicon thin film by forming a metal layer in the groove.

The groove is formed downward from an upper portion of the amorphous silicon thin film, and then a side surface portion of amorphous silicon thin film is exposed by forming the groove.

A depth of the groove is less than or equal to that of the thin film, and at least one groove is formed.

In the present invention, the method may further comprise a step of forming an insulating film between the substrate and the amorphous silicon thin film. The insulating film may be formed to prevent impurities of the substrate from penetrating into the amorphous silicon thin film, and may use an oxide insulating film (SiOx) or a nitride insulating film (SiNx).

In the present invention, a step of implanting metal ions into the amorphous silicon thin film formed on the substrate is added, thereby facilitating metal induced crystallization.

The metal of the metal layer or metal ions may use transition elements such as Al, Ni, Co, and the like, and preferably use Ni.

The method of the present invention may further comprise a step of forming a mask layer on an upper portion of the amorphous silicon thin film. When the mask layer is formed, the groove is formed on the amorphous silicon thin film uncovered by the mask layer.

In the present invention, the groove can be formed in a line pattern by patterning the amorphous silicon thin film using a laser scribing method. The line pattern is one line pattern to which grooves are serially connected when the photovoltaic device is observed from the top.

A cross-sectional shape of the groove is a V shape, a U shape, or a tetragonal shape, and the silicon thin film is exposed on a side surface of the groove.

The metal layer is disposed on an upper portion of the groove, and a thickness of the metal layer is in a range of a nanometer level and may be preferably 1 nm to 100 nm, but the present is not limited thereto.

In the present invention, the crystallization can be facilitated by performing a heat treatment in a state in which an electric field or a magnetic field is applied when the amorphous silicon thin film is horizontally crystallized.

The heat treatment should be performed at a temperature in a range in which a glass substrate is not deteriorated, and is preferably performed at a temperature of 400° C. to 550° C.

The method of the present invention may further comprise a defect annealing step or a hydrogen passivation step after the step of horizontally crystallizing the amorphous silicon thin film.

According to the metal induced crystallization proposed in the present invention, the crystallization is progressed in a horizontal direction from a side surface rather than an upper or lower surface of amorphous Si, and a crystal size and pattern are regularly controlled.

Since a crystallization direction is the horizontal direction, a silicon crystal pattern has a column shape grown in a length of the horizontal direction longer than that of the vertical direction.

Grain boundary surfaces and the number of defects occurring in the surfaces are significantly reduced in the horizontal direction of the silicon thin film.

The number of defects within the silicon thin film can be adjusted by Si crystal growth horizontally progressed from the side surface, irrespective of the thin film thickness.

Specifically, a current conductivity value of the horizontal direction obtainable by the silicon thin film layer making contact with the insulating film is significantly improved by significantly reducing the grain boundary surface in a current traveling direction in the crystallization method proposed in the present invention.

A crystallization rate can be increased and adjusted by not only supplying a metal layer for starting initial Si crystallization, but also supplying another metal for continuously facilitating the progress of the crystallization.

Advantageous Effects

The present invention can be used to improve the efficiency of a poly-crystal silicon solar cell by manufacturing a low-temperature poly-crystal Si film using metal induced crystallization of a horizontal direction, increasing current conductivity within a silicon thin film, and significantly reducing an amount of leakage electricity.

Moreover, the present invention provides a process for manufacturing a silicon thin film solar cell that can perform metal induced crystallization in the horizontal direction.

According to the present invention, a solar cell device having high photoelectric conversion efficiency can be manufactured at low cost.

BRIEF DESCRIPTION OF THE DRAWINGS

FIG. 1 is a schematic view showing a method for manufacturing a photovoltaic device using conventional metal induced crystallization as a prior art.

FIGS. 2 to 10 are cross-sectional views showing a method for manufacturing a photovoltaic device using horizontal metal induced crystallization according to an embodiment of the present invention.

FIG. 11 is a flowchart showing a method for manufacturing a photovoltaic device using horizontal metal induced crystallization according to an embodiment of the present invention.

BEST MODE FOR CARRYING OUT THE INVENTION

Hereinafter, preferred embodiments of the present invention will be described with reference to the accompanying drawings.

Descriptions of well-known functions and constructions are omitted for clarity and conciseness.

FIGS. 2 to 10 are cross-sectional views showing a method for manufacturing a photovoltaic device using horizontal metal induced crystallization according to an embodiment of the present invention.

That is, FIGS. 2 to 10 are process views proposed to adjust a Si crystal shape and a growth direction in manufacturing a poly-crystal Si solar cell using metal induced crystallization.

As seen from FIG. 2, amorphous silicon thin films 203 of a multilayer structure are deposited on an insulating film (SiNx, SiOx) 202 deposited on a glass substrate 201 using a chemical vapor deposition (CVD) method. The Si films can be formed in p and n layers according to different doping types and concentrations. An arrangement of the silicon thin film layers can be variously varied according to solar cell structures.

In FIG. 3, a minute amount of Ni is implanted into the amorphous Si films by ion implantation or sputtering. An amount of metal implanted in this process is set under an optimum condition. According to the optimum condition, the metal amount should be small such that Si is not independently crystallized through mutual coupling and clear nucleus generation according to diffusion within Si during a heat treatment, but the metal amount should be sufficient such that crystallization of a horizontal direction can be promoted by providing an additional Ni amount to Si crystallization progressed from the metal of a side surface thereafter.

In FIG. 4, after a minute amount of Ni is implanted, the entire surface of the amorphous Si is covered by a mask 204 for crystallization from the side surface through partial Ni film deposition to be performed in the next step.

Next, as shown in FIG. 5, a part of the Si and mask layers deposited on the glass substrate is removed in a line pattern by a laser scribing method for a device design.

The removed part forms a gentle valley pattern and a diameter thereof is controlled at several tens of mm. A width of the remaining Si film between valleys can be adjusted in a value increasing from several tens of mm.

Except for the surface of the amorphous silicon thin film covered by the mask 204, a side surface of the part removed by the laser scribing method is an amorphous silicon thin film unprotected by the mask. In FIG. 6, a metal layer 205, particularly, a Ni metal layer, is deposited along the side surface of the amorphous silicon thin film by sputtering or CVD equipment. In general, this metal layer is deposited at a thickness of a nanometer level, and is preferably deposited at several tens of nanometers.

From FIGS. 7 and 8, it can be seen that the crystal silicon is grown by forming a NiSi 2 phase from an amorphous Si film close to the Ni metal layer 205 and generating a Si nucleus, and horizontal growth to an opposite side surface is gradually progressed. At this time, the horizontal growth of silicon poly-crystal is promoted by continuously supplying metal from Ni ions already implanted into an amorphous material on a boundary surface of a crystal silicon thin film 206 progressed in the amorphous silicon thin film.

In FIG. 9, it can be seen that crystallization is stopped when silicon crystal is sufficiently grown in the horizontal direction and then reaches crystal silicon grown from a side surface of the neighboring silicon in the same horizontal direction.

In FIG. 10, the high-quality poly-crystal silicon thin film 206 usable in the solar cell is manufactured through a defect annealing step or a hydrogen passivation step.

FIG. 11 is a flowchart showing a method for manufacturing a photovoltaic device using metal induced crystallization according to an embodiment of the present invention.

Referring to FIG. 11, the solar cell manufacturing method of the present invention comprises a process for disposing an amorphous silicon thin film on a substrate (S301), a process for sputtering or implanting metal ions, particularly, Ni ions (S302), a process for forming a mask thereon (S303), a process for patterning the amorphous silicon thin film by a laser scribing method (S304), a process for depositing a metal layer, particularly, a Ni layer, on a patterned portion (S305), and a process for removing the mask (S306), a process for performing a heat treatment in a state in which an electric field or a magnetic field is applied (S307), and a process for completing crystallization of the silicon thin film (S308).

Grooves connected in a line pattern are formed on the amorphous silicon thin film layer by patterning.

While the present invention has been shown and described with reference to preferred embodiments thereof, it will be understood by those skilled in the art that various changes and modifications may be made without departing from the spirit and scope of the present invention as defined by the appended claims.

INDUSTRIAL APPLICABILITY

The present invention can be used to improve the efficiency of a poly-crystal silicon solar cell by manufacturing a low-temperature poly-crystal Si film using metal induced crystallization of a horizontal direction, increasing current conductivity within a silicon thin film, and significantly reducing an amount of leakage electricity.

Moreover, the present invention provides a process for manufacturing a silicon thin film solar cell that can perform metal induced crystallization in the horizontal direction.

According to the present invention, a solar cell device having high photoelectric conversion efficiency can be manufactured at low cost.

The invention claimed is:

1. A method for manufacturing a poly-crystal silicon photovoltaic device using horizontal metal induced crystallization, the method comprising the steps of:
   forming at least one layer of an amorphous silicon thin film on a substrate;
   forming at least one groove on the amorphous silicon thin film to expose a side surface portion of the amorphous silicon thin film, the groove having a depth less than or equal to that of the amorphous silicon thin film;
   forming a metal layer on an upper portion of the groove; and
   horizontally crystallizing the amorphous silicon thin film by heat treatment,
   wherein the horizontal crystallizing is progressed in a horizontal direction from the side portion of the amorphous silicon thin film, and produces a silicon crystal pattern having a column shape grown to have a length in the horizontal direction that is longer than a length in a vertical direction.

2. The method according to claim 1, further comprising the step of forming an insulating film between the substrate and the amorphous silicon thin film.

3. The method according to claim 1, further comprising the step of implanting metal ions into the amorphous silicon thin film formed on the substrate.

4. The method according to claim 3, wherein the metal is Ni.

5. The method according to claim 1, wherein the metal is Ni.

6. The method according to claim 1, further comprising the step of forming a mask layer on an upper portion of the amorphous silicon thin film.

7. The method according to claim 1, wherein the groove is formed in a line pattern by patterning the amorphous silicon thin film using a laser scribing method.

8. The method according to claim 1, wherein the groove is formed by removing the amorphous silicon thin film in a V shape, a U shape, or a tetragonal shape.

9. The method according to claim 1, wherein the step of horizontally crystallizing the amorphous silicon thin film comprises the step of performing a heat treatment in a state in which an electric field or a magnetic field is applied.

10. The method according to claim 9, wherein the heat treatment is performed at a temperature of 450° C. to 550° C.

11. The method according to claim 1, further comprising the step of a defect annealing or a hydrogen passivation after the step of horizontally crystallizing the amorphous silicon thin film.

12. The method according to claim 1, wherein the heat treatment is performed in a state in which an electric field or a magnetic field is applied.

13. A method for manufacturing a poly-crystal silicon photovoltaic device using horizontal metal induced crystallization, the method comprising the steps of:
   forming at least one layer of an amorphous silicon thin film on a substrate;
   forming a mask layer on an upper portion of the amorphous silicon thin film;

forming at least one groove on the amorphous silicon thin film, the groove having a depth less than or equal to that of the amorphous silicon thin film; and horizontally crystallizing the amorphous silicon thin film by forming a metal layer on an upper portion of the groove.

14. The method according to claim 13, wherein the groove is formed in a V shape, a U shape, or a tetragonal shape.

15. A method for manufacturing a poly-crystal silicon photovoltaic device using horizontal metal induced crystallization, the method comprising the steps of:

forming at least one layer of an amorphous silicon thin film on a substrate;

forming at least one groove on the amorphous silicon thin film, the groove having a depth less than or equal to that of the amorphous silicon thin film; and horizontally crystallizing the amorphous silicon thin film by forming a metal layer on an upper portion of the groove, wherein the groove is formed in a line pattern by patterning the amorphous silicon thin film using a laser scribing method.

16. The method according to claim 15, wherein the groove is formed in a V shape, a U shape, or a tetragonal shape.

* * * * *